US012125532B2

(12) United States Patent
Murillo (10) Patent No.: US 12,125,532 B2
(45) Date of Patent: Oct. 22, 2024

(54) MEMORY ARCHITECTURE FOR SERIAL EEPROMS

(71) Applicant: STMicroelectronics (Rousset) SAS, Rousset (FR)

(72) Inventor: Laurent Murillo, Marseilles (FR)

(73) Assignee: STMicroelectronics (Rousset) SAS, Rousset (FR)

(*) Notice: Subject to any disclaimer, the term of this patent is extended or adjusted under 35 U.S.C. 154(b) by 83 days.

(21) Appl. No.: 17/459,172

(22) Filed: Aug. 27, 2021

(65) Prior Publication Data

US 2022/0076749 A1  Mar. 10, 2022

(30) Foreign Application Priority Data

Sep. 7, 2020  (FR) ..................... 2009060

(51) Int. Cl.
| | | |
|---|---|---|
| *G11C 16/04* | (2006.01) | |
| *G11C 16/10* | (2006.01) | |
| *G11C 16/14* | (2006.01) | |
| *G11C 16/24* | (2006.01) | |
| *G11C 16/26* | (2006.01) | |
| *G11C 16/30* | (2006.01) | |

(52) U.S. Cl.
CPC ........ *G11C 16/0433* (2013.01); *G11C 16/102* (2013.01); *G11C 16/14* (2013.01); *G11C 16/24* (2013.01); *G11C 16/26* (2013.01); *G11C 16/30* (2013.01)

(58) Field of Classification Search
CPC ... G11C 16/0433; G11C 16/102; G11C 16/14; G11C 16/24; G11C 16/26; G11C 16/30; G11C 16/10; G11C 16/16; H10B 41/35

USPC ................................................. 365/185.01
See application file for complete search history.

(56) References Cited

U.S. PATENT DOCUMENTS

| | | | |
|---|---|---|---|
| 5,963,476 A | 10/1999 | Hung et al. | |
| 8,139,408 B2* | 3/2012 | Georgescu | H10B 41/41 |
| | | | 365/185.01 |
| 8,295,087 B2* | 10/2012 | Lee | G11C 16/3445 |
| | | | 365/185.26 |
| 9,361,995 B1 | 6/2016 | Tran et al. | |
| 2004/0017722 A1 | 1/2004 | Cavaleri et al. | |
| 2004/0027856 A1 | 2/2004 | Lee et al. | |
| 2016/0155506 A1 | 6/2016 | Tailliet | |
| 2017/0242608 A1 | 8/2017 | Tailliet | |

(Continued)

FOREIGN PATENT DOCUMENTS

KR    20010072189 A  *  7/2001

*Primary Examiner* — Tha-O H Bui
(74) *Attorney, Agent, or Firm* — Slater Matsil, LLP (57) ABSTRACT

In an embodiment an electrically erasable programmable readable memory includes a plurality of memory cells organised in a memory plane arranged in a matrix fashion in rows and in columns, wherein each memory cell includes a state transistor having a source region, a drain region, an injection window situated on the side of the drain, a control gate and a floating gate and an isolation transistor having a source region, a drain region and a gate; and an isolation barrier including a buried layer and at least one wall extending from the buried layer to a surface of a substrate, wherein the at least one wall is perpendicular to the buried layer, and wherein the isolating barrier forms an interior substrate surrounding at least one of the memory cells and isolating it from the remainder of the substrate.

20 Claims, 7 Drawing Sheets

(56) References Cited

U.S. PATENT DOCUMENTS

| | | |
|---|---|---|
| 2019/0067307 A1 | 2/2019 | Tailliet et al. |
| 2019/0088665 A1* | 3/2019 | Tailliet .............. H01L 29/42376 |
| 2019/0147960 A1 | 5/2019 | Menezes et al. |

* cited by examiner

MEMORY ARCHITECTURE FOR SERIAL EEPROMS

CROSS-REFERENCE TO RELATED APPLICATIONS

This application claims the benefit of French Patent Application No. 2009060, filed on Sep. 7, 2020, which application is hereby incorporated herein by reference.

TECHNICAL FIELD

The present divulgation relates to non-volatile memories of electrically erasable programmable read only memory (EEPROM) type.

BACKGROUND

An EEPROM (also called E2PROM or E2PROM) is a type of read-only memory that may be erased and reprogrammed several times (from 100,000 to 1,000,000 times) and read an unlimited number of times. An EEPROM is generally constituted of a plurality of memory cells.

Figure 1:
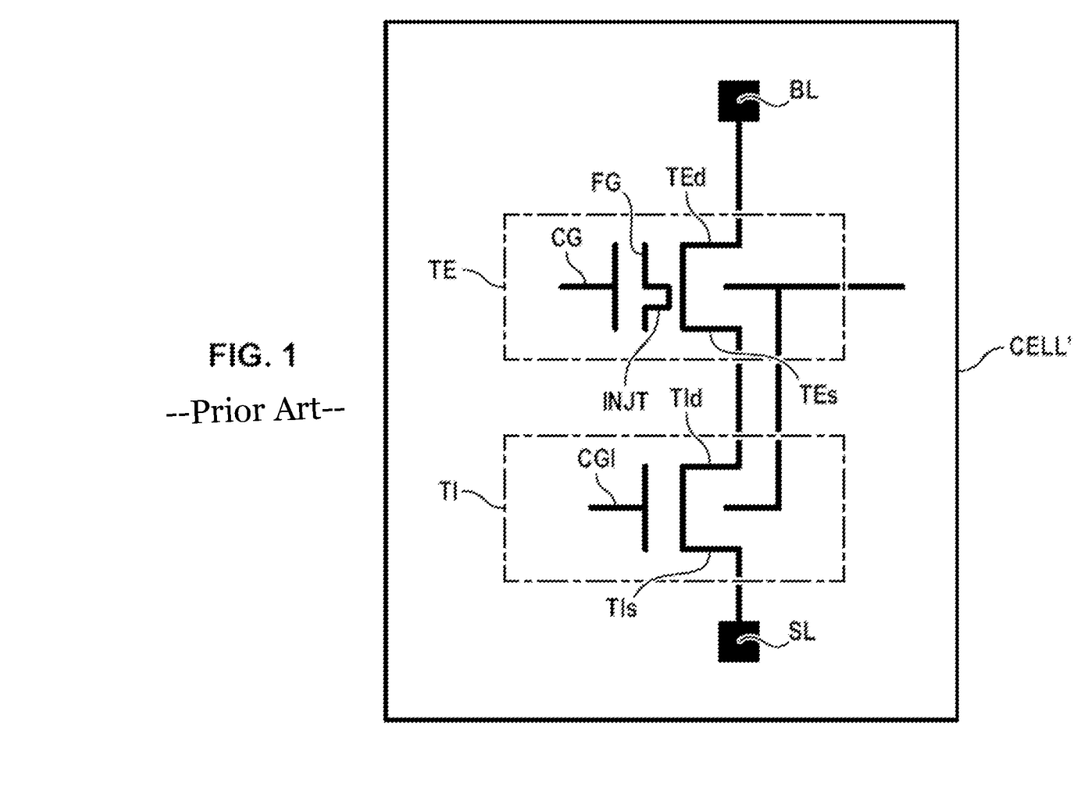
FIG. 1 schematically illustrates a prior art memory cell.

FIG. 1 schematically illustrates a memory cell such as described in the prior art.

More specifically, the cell CELL' represents an example of architecture of such a memory cell of an EEPROM derived from the French Patent No. FR3071355. This memory cell comprises a state transistor TE, an isolation transistor TI and connections to a source line SL and to a bit line BL (also known by the term "binary line" or "bitline").

The state transistor TE comprises a source TEs, a drain TEd, a control gate CG and a floating gate FG. The state transistor TE makes it possible to store in a non-volatile manner in its floating gate FG a charge representative of a logical datum. The injections and extractions of charges take place via an injection window INJT here situated on the side of the source TEs of the state transistor TE, enabling the implementation of the Fowler-Nordheim effect.

The isolation transistor TI comprises a source TIs, a drain TId and a control gate CGI. The isolation transistor TI makes it possible to couple, through conduction terminals, the state transistor TE to the source line SL, and thus to isolate it or not.

In general, in a known manner, an EEPROM type memory is able to store memory words belonging to a memory plane comprising lines and columns. A memory word conventionally comprises eight memory cells CELL' situated on a same line. A line (also known as "page") then comprises a succession of memory words organized in the sense of a first direction X, and a column COL comprises a succession of memory words organized in the sense of a second direction Y perpendicular to the first direction X. The intersection of a line and a column forms a memory word (also known as "byte").

Within the scope of the use of this type of memory cell, writing normally comprises an erasing step followed by a programming step. The voltages applied to the state transistor TE during writing (+/−15 V) are high. This leads to high energy consumption and bulk on the substrate of the chip in order to place in particular the charge pump making it possible to obtain such a voltage.

SUMMARY

Embodiments overcome the aforesaid drawbacks by providing an EEPROM and a method for writing this memory making it possible to limit the voltages necessary for the writing.

Embodiments propose a memory of electrically erasable programmable read only memory type formed in and on a semiconductor substrate and comprising a plurality of memory cells organised in a memory plane arranged in a matrix fashion in rows and in columns of memory cells, each memory cell comprising a state transistor comprising a source region, a drain region, an injection window (INJT) situated on the side of the drain (Ted), a control gate and a floating gate, and an isolation transistor having a source region, a drain region and a gate (CGI), the drain region of the isolation transistor and the source region of the state transistor being common. The memory is characterised in that it also comprises an isolation barrier comprising a buried layer, and at least one wall extending from the buried layer to the surface of the substrate and perpendicularly to the buried layer, the isolating barrier forming an interior substrate which surrounds at least one of the memory cells and isolates it from the remainder of the substrate.

The memory may be implemented in the following manner.

In an embodiment, the control gate of the state transistor is connected to a control gate line of the memory. The source region of the isolation transistor is connected to a source line of the memory. The gate of the isolation transistor is connected to a word line of the memory. The drain region of the state transistor is connected to a bit line.

In an embodiment, the isolation barrier is configured to isolate together all the memory cells of the memory plane.

In an embodiment, the memory comprises a device for erasing a memory word configured to leave the bit lines floating, apply a first positive voltage to the control gate lines associated with the memory cells of the memory word to erase, connect to earth the control gate lines of the memory cells which are not associated with the memory word to erase, connect to earth the word lines, connect to earth the source lines and connect to earth the interior substrate.

In an embodiment, the difference between the first voltage and earth enables a Fowler-Nordheim effect by injection of a charge of electrons into the floating gate of the state transistor.

In an embodiment, the isolation barrier is configured to isolate together all the memory cells belonging to a column of the memory plane.

In an embodiment, the memory comprises a device for erasing a memory word configured to leave the bit lines floating, apply a second positive voltage to the control gate lines associated with the memory cells of the memory word to erase, connect to earth the control gate lines of the memory cells which are not associated with the memory word to erase, connect to earth the word lines, apply a first negative voltage to the source lines and apply the first negative voltage to the interior substrate.

In an embodiment, the difference in voltages between the second positive voltage and the first negative voltage enables a Fowler-Nordheim effect by injection of a charge of electrons into the floating gate of the state transistor.

In an embodiment, the memory comprises a programming device configured to apply a positive voltage to the bit lines of the memory cells to programme of the memory word to programme, apply a positive voltage to the bit lines of the memory cells which are not to programme, the positive voltage applied to the bit lines of the memory cells which are not to programme being less than the positive voltage applied to the bit lines of the memory cells to programme, apply a negative voltage to the control gate lines of the memory cells associated with the memory word to programme, apply a positive voltage to the control gate lines of the memory cells situated on the same column as the memory word to programme, connect to earth the control gate lines of the memory cells which are not associated with the memory word to programme, connect to earth the word lines, apply a positive voltage to the source lines and connect to earth the interior substrate.

In an embodiment, the positive voltage applied to the bit lines of the memory cells to programme of the memory word to programme is around 9.5V, the positive voltage applied to the bit lines of the memory cells which are not to programme is around 3.3V, the negative voltage applied to the control gate lines of the memory cells associated with the memory word to programme is around −3.3V, the positive voltage applied to the control gate lines of the memory cells situated on the same column as the memory word to programme is around 6V and the positive voltage applied to the source lines is around 3.3V.

In an embodiment, the memory comprises a reading device configured to apply a positive voltage to the bit lines of the memory cells of the memory word to read, apply a positive voltage to the control gate lines of the memory cells of the memory word to read, connect to earth the control gate lines of the memory cells which are not associated with the memory word to read, apply a positive voltage to the word lines of the memory cells of the row associated with the memory word to read, connect to earth the word lines of the memory cells which are not situated on the row associated with the memory word to read, connect to earth the source lines and connect the interior substrate to earth.

In an embodiment, the positive voltage applied to the bit lines of the memory cells of the memory word to read is 1V and the positive voltage applied to the control gate lines of the memory cells of the memory word to read is 0.5V and the positive voltage applied to the word lines of the memory cells of the row associated with the memory word to read is VDD.

Another aspect of the invention proposes a method for writing at least one memory cell of a memory word of a memory, the method comprising a phase of erasing the memory word, by a step of application of a positive voltage to the control gate lines associated with the memory cells of the memory word to write, a step of connection to earth of the control gate lines of the memory cells which are not associated with the memory word to write, a step of connection to earth of the word lines, a step of application of a negative voltage to the source lines and a step of application to the interior substrate of a second negative voltage. The method also comprises a phase of programming the memory word, by a step of application of a positive voltage to the bit lines of the memory cells to write of the memory word to write, a step of application of a positive voltage to the bit lines of the memory cells which are not to write, a step of application of a negative voltage to the control gate lines of the memory cells associated with the memory word to write, a step of application of a positive voltage to the control gate lines of the memory cells situated on the same column as the memory word to write, a step of connection to earth of the control gate lines of the memory cells which are not associated with the memory word to write, a step of connection to earth of the word lines, a step of application of a positive voltage to the source lines and a step of connection to earth of the interior substrate.

The method may be implemented in the following manner.

In an embodiment, the positive voltage applied to the control gate lines associated with the memory cells of the memory word to write is 11V and the negative voltage applied to the source lines is −3.3V and the negative voltage applied to the interior substrate is −3.3V and the positive voltage applied to the bit lines of the memory cells to write of the memory word to write is 9.5V and the positive voltage applied to the bit lines of the memory cells which are not to write is 3.3V and the negative voltage applied to the control gate lines of the memory cells associated with the memory word to write is −3.3V and the positive voltage applied to the control gate lines of the memory cells situated on the same column as the memory word to write is 6V and the positive voltage applied to the source lines is 3.3V.

BRIEF DESCRIPTION OF THE DRAWINGS

Other characteristics, aims and advantages of the invention will become clear from the description that follows, which is purely illustrative and non-limiting, and which should be read with regard to the appended drawings in which.

DETAILED DESCRIPTION OF ILLUSTRATIVE EMBODIMENTS

Unless stated otherwise, when reference is made to two elements connected together, this signifies directly connected without intermediate element other than conductors, and when reference is made to two elements connected or coupled together, this signifies that these two elements may be connected or linked or coupled through one or more other elements.

Figure 2:
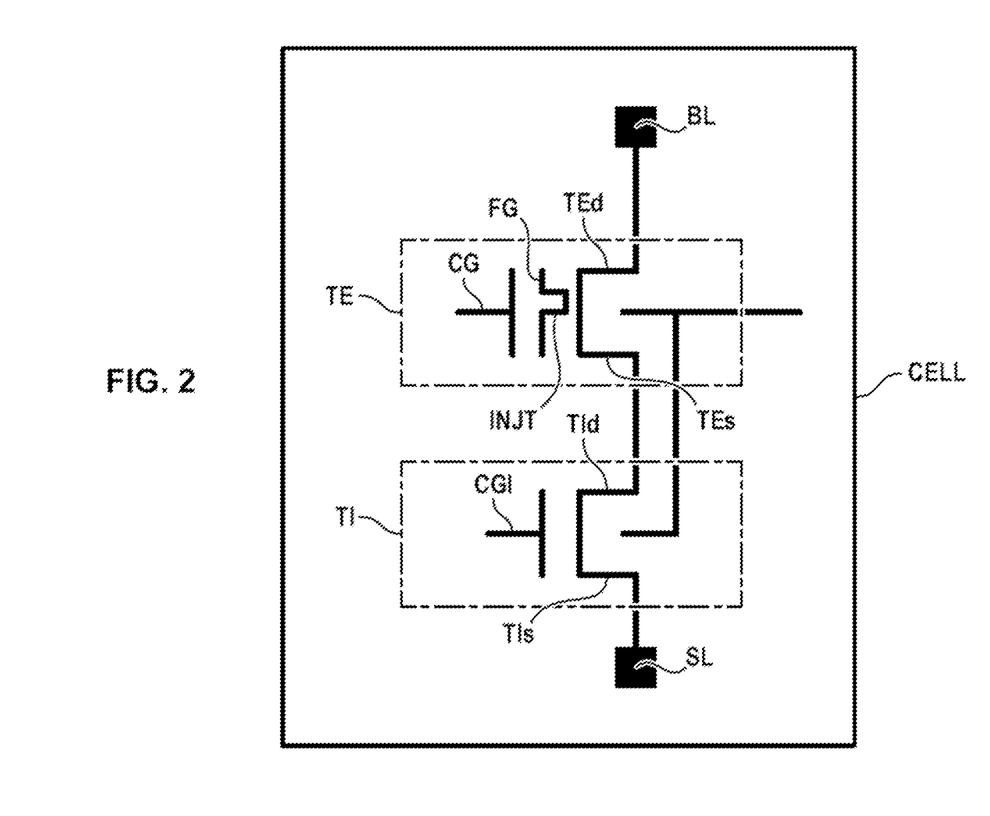
FIG. 2 schematically illustrates a memory cell according to an embodiment.

FIG. 2 schematically illustrates a memory cell according to an embodiment.

The memory cell CELL comprises a state transistor TE, an isolation transistor TI, and connections to a source line SL and to a bit line BL.

The transistor TE comprises a source TEs, a drain TEd, a control gate CG and a floating gate FG. This state transistor TE makes it possible to store in a non-volatile manner in its floating gate a charge representative of a logical datum. The isolation transistor TI comprises a source TIs, a drain TId and a control gate CGI. The isolation transistor TI makes it possible to couple, through conduction terminals, the state transistor TE to the source line SL.

Unlike the cell CELL' illustrated in FIG. 1, the injections and extractions of charges take place via an injection window (INJT) situated on the side of the drain TEd of the state transistor TE.

Figure 3:
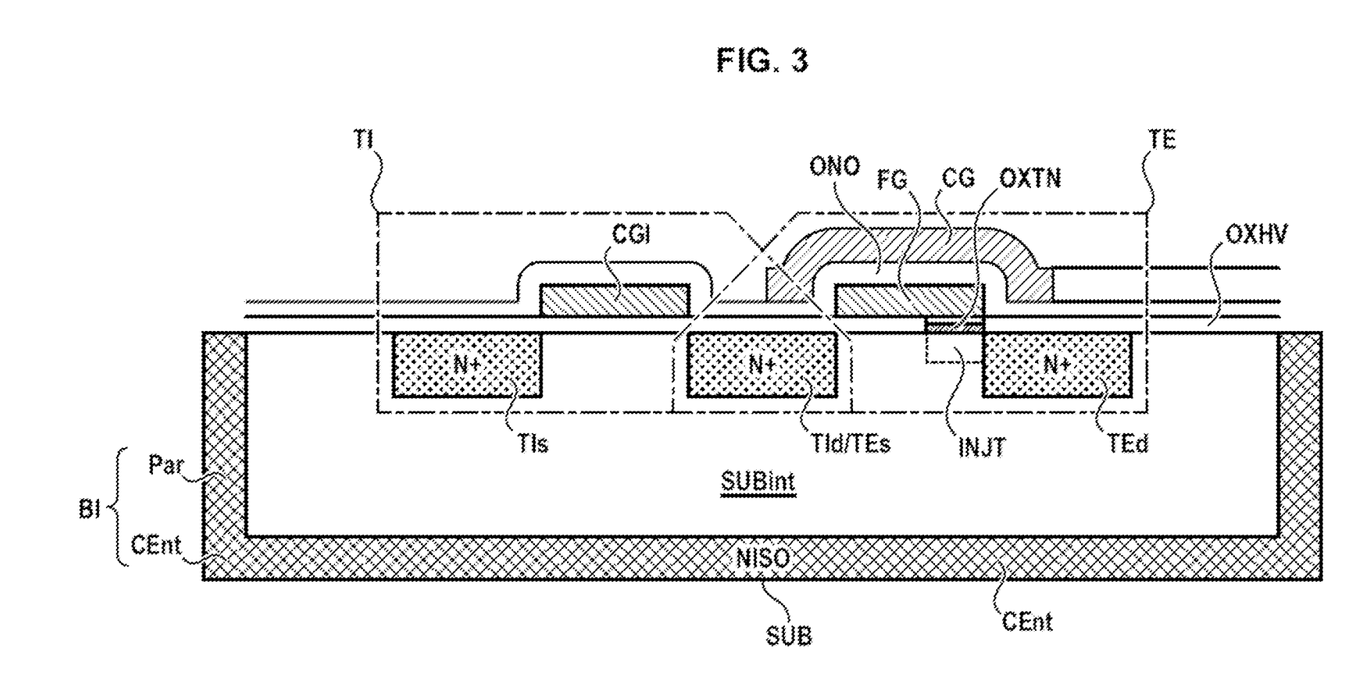
FIG. 3 illustrates a sectional view of the memory cell according to FIG. 2.

FIG. 3 illustrates a sectional view of the memory cell according to FIG. 2.

The memory cell CELL comprises the isolation transistor TI and the state transistor TE in series, formed in and on a semiconductor substrate SUB of a first type of conductivity, for example of P type.

The state transistor TE comprises a source region TEs and a drain region TEd, semiconducting of a second type of conductivity opposite to the first type of conductivity, implanted on the surface of the substrate SUB. If the first type of conductivity is of P type, the second type of conductivity will be of N type and vice versa. The state transistor TE comprises a control gate CG surmounting a floating gate FG.

The isolation transistor TI comprises a source region TIs, a drain region TId and a control gate CGI. These source TIs and drain TId regions are also implanted on the surface of the substrate SUB, semiconducting and of the same type of conductivity as the source TEs and drain TEd regions of the state transistor TE. The control gate CGI may rest on a dielectric layer OXHV (200 Angstroms) separating it from the substrate.

The isolation transistor TI is coupled on its source region TIs to a source line SL, and the state transistor TE is coupled on its drain region TEd to a bit line BL (not shown). The source TEs of the state transistor and the drain TId of the isolation transistor are formed by an implanted region common to the two transistors TI, TE.

In the state transistor TE, the control gate CG and the floating gate FG are mutually electrically isolated by a control gate dielectric layer ONO. The layer ONO (140 Angstroms) comprises for example an alternation of layers of silicon nitride and silicon oxide. The floating gate FG may rest on a dielectric layer OXTN (76 Angstroms) separating it from the substrate.

The memory cell CELL is formed in a zone of substrate entirely isolated from the remainder of the substrate by the combination of the following elements forming a semiconductor isolation barrier BI comprising:

A buried layer CEnt, and

A wall Par extending from the buried layer to the surface of the substrate, perpendicular to the buried layer and following the perimeter of the buried layer CEnt.

The dimensions (thickness, width, etc.) of these elements depend on the technology used.

These elements may be produced in an N doped substrate and enabling isolation (commonly known by the term "NISO region").

The combination of the buried layer CEnt and the wall Par makes it possible to isolate completely the substrate surrounding the cell, called interior substrate SUBint, from the remainder of the substrate SUB. This makes it possible to place the potential of the interior substrate SUBint at a voltage different to that of the substrate SUB.

Figure 4:
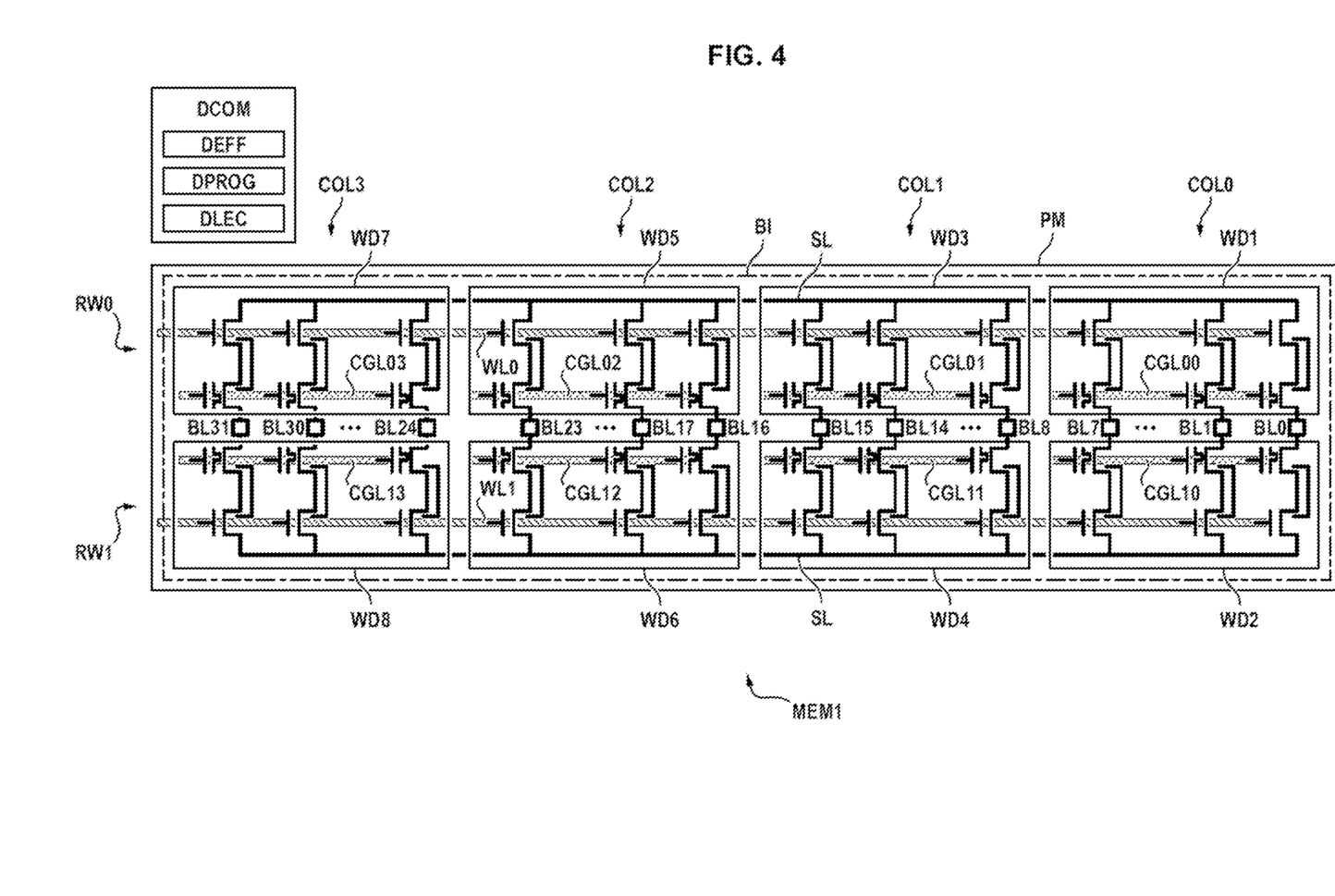
FIG. 4 schematically illustrates a memory according to another embodiment.
Figure 6:
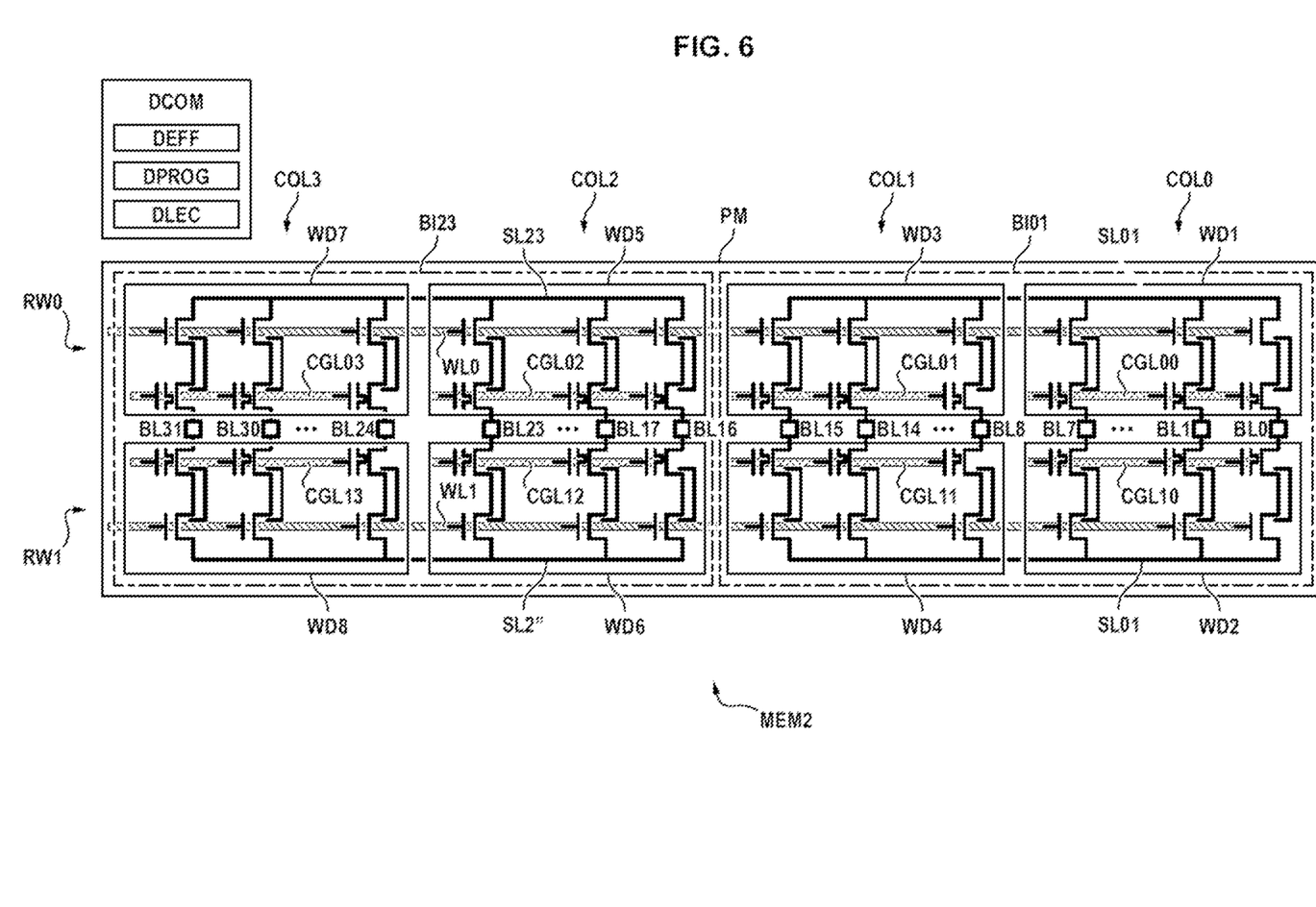
FIG. 6 schematically illustrates a memory according to a further embodiment.
Figure 7:
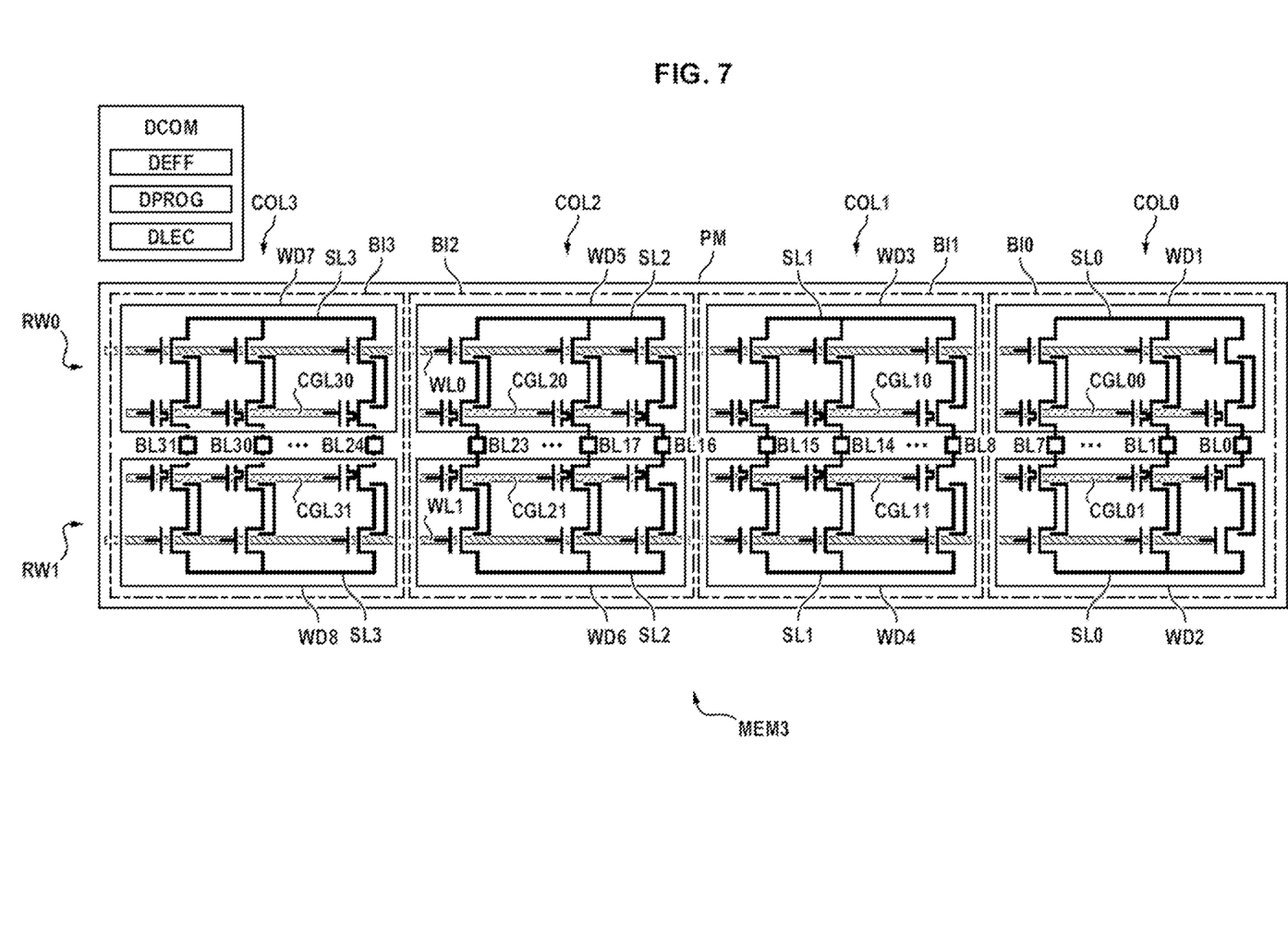
FIG. 7 schematically illustrates a memory according to yet a further embodiment.

This isolation may be achieved in several different ways:
by isolating together all the memory cells of the memory (WD1 to WD8 as shown in FIG. 4);
by isolating together the cells of several columns (WD1 to WD4, W5 to W8 as shown in FIG. 6); or
by isolating independently and together the cells of each column (WD1 and WD2, WD3 and WD4, WD5 and WD6, WD7 and WD8, as shown in FIG. 7).

Each of these solutions offers advantages and drawbacks.

Isolation by column makes it possible to reduce the consumption of the EEPROM during writing (by applying the voltages uniquely to the memory word to write) to the detriment of the surface area of the memory plane PM.

FIG. 4 schematically illustrates a memory MEM1 according to a first embodiment.

For reasons of simplicity of the description, the memory MEM1 comprises memory cells distributed in only two lines RWi (i being an index from 0 to 1, here RW0, RW1) and in four columns COLj (j being an index from 0 to J, here COL0, COL1, COL2, COL3) for a total of 64 memory cells, forming eight words WD1 to WD8. Each line RWi then comprises 32 memory cells distributed in four memory words, each memory word thus comprising eight memory cells. The memory represented in FIG. 4 thus comprises eight memory words (WD1 to WD8).

In the embodiment of FIG. 4 the memory plane PM is provided with:
thirty two bit lines BLk (k being an index from 0 to K, here BL0 to BL31) connected respectively to the drain regions TEd of all the state transistors TE,
eight control gate lines CGLij (CGL00, CGL01, CGL02, CGL03, CGL10, CGL11, CGL12, CGL13) connected to the control gates CG of the state transistors TE of one of the eight memory words through a control gate switch dedicated to each memory word WD1 to WD8, not represented in FIG. 4,
two word lines WLi (WL0 and WL1), each line is connected to the gates CGI of the isolation transistors TI of each row RWi (RW0, RW1), and
a source line SL connected to the source regions TIs of all the isolation transistors TI.

The memory represented in FIG. 4 further comprises a control device DCOM comprising an erasing device DEFF, a programming device DPROG and a reading device of the memory DLEC.

The erasing device DEFF is intended to implement a method for erasing a memory cell CELL, by applying voltages to the control gate lines CGLij, the bit lines BLk, the word lines WLi and the source line SL.

With reference to the memory words WD1 to WD8 represented in FIG. 4, if the memory word WD1 is to erase and the memory words WD2 to WD8 are to conserve (i.e. not to erase), the erasing device DEFF is configured to:
leave all the bit lines BLk (BL0 to BL31) floating,
apply a high positive voltage, for example 10.5 V, to the control gate line CLGij associated with the memory word to erase (here CGL00),
place to earth (GND) the control gate lines CGLij (CGL01, CGL02, CGL03, CGL10, CGL11, CGL12, CGL13) associated with the memory words to conserve (WD2 to WD8),
place to earth (GND) all the word lines WLi (WL0, WL1),
apply a negative voltage, for example −3.3 V, to the source line SL, and
place the interior substrate SUBint at a negative voltage, for example −3.3 V.

The difference between the high positive voltage and the negative voltage enables the injection by Fowler-Nordheim effect of a charge of electrons into the floating gate. These voltages then may vary according to the architecture of the memory and the technology used for the manufacture.

The following table 1 summarises the voltages to apply to erase the memory word WD1 and to conserve the memory words WD2 to WD8.

TABLE 1

| Line Select. | Column Select. | Mot | BL | CGL | WL | SL | SUBint |
|---|---|---|---|---|---|---|---|
| YES | YES | WD1 | Floating | 10.5 V | GND | −3.3 V | −3.3 V |
| YES | NO | WD3, WD5, WD7 | Floating | GND | GND | −3.3 V | −3.3 V |
| NO | YES | WD2 | Floating | GND | GND | −3.3 V | −3.3 V |
| NO | NO | WD4, WD6, WD8 | Floating | GND | GND | −3.3 V | −3.3 V |

Table 1: Erasing Voltages of the Memory Plane (FIG. 4)

With reference to the memory words WD1 to WD8 represented in FIG. 4, if it is wished to programme at least certain memory cells of at least one memory word WD1, the programming device DPROG is configured to, during a programming:
- apply a high positive voltage, for example 9.5 V, to the bit lines BLk coupled to the cells to programme (for example, BL1, BL3, BL5, BL7),
- apply a low positive voltage, for example 3.3 V, to the other bit lines BLk coupled to the cells not to programme (for example, BL0, BL2, BL4, BL6 and BL8 to BL31),
- apply a negative voltage, for example −3.3 V, to the control gate line (CGL00) associated with the memory word to programme (WD1),
- apply a positive voltage, for example 6 V, to the control gate line (CGL10) associated with the memory word (WD2) situated on the same column (COL0) as the memory word to programme (WD1),
- place to earth (GND) the control gate lines (CGL01, CGL02, CGL03, CGL11, CGL12, CGL13) associated with the other memory words (WD3 to WD8),
- place to earth (GND) all the word lines (WL0, WL1),
- apply a positive voltage, for example 3.3 V, to the source line (SL), and
- place the interior substrate SUBint to earth (GND).

The following table 2 summarises the voltages to apply to programme the memory word WD1 without affecting the memory words WD2 to WD8.

TABLE 2

| Line Select. | Column Select. | Mot | BL | CGL | WL | SL | SUBint |
|---|---|---|---|---|---|---|---|
| YES | YES | WD1 | 9.5 V/3.3 V | −3.3 V | GND | 3.3 V | GND |
| YES | NO | WD3, WD5, WD7 | 3.3 V | GND | GND | 3.3 V | GND |
| NO | YES | WD2 | 9.5 V/3.3 V | 6 V | GND | 3.3 V | GND |
| NO | NO | WD4, WD6, WD8 | 3.3 V | GND | GND | 3.3 V | GND |

Table 2: Programming Voltages of the Memory Plane (FIG. 4)

As a reminder, for the memory word to programme (WD1), the bit lines BLk of the memory cells to programme are placed at 9.5 V and the bit lines BL of the memory cells not to programme are placed at 3.3 V. The bit lines BLk of a given column being common to all the words of the column, these voltages are also applied to the memory cells not to programme of a word (WD2) of the same column (COL0). Nevertheless, the voltage applied to the control gate line (CGL10) of the word not to programme prevents any rewriting of these memory cells.

With reference to the memory words WD1 to WD8 represented in FIG. 4, to read at least certain memory cells (for example a single cell, several cells or all the cells of a word), the reading device DLEC is configured to, during a reading:
- apply a weak positive voltage, for example 1 V, to the bit lines BLk belonging to the columns COLj that contain memory cells to read,
- leave the bit lines BLk belonging to the columns that contain memory cells not to read floating,
- apply a positive voltage, for example 0.5 V, to the control gate line CGLij associated with the memory word to read. In an alternative it is possible to connect to earth the control gate line CGLij associated with the memory word to read. Applying a positive voltage (0.5 V) makes it possible to accelerate reading, whereas connecting the control gate lines CGLij to earth makes it possible to limit consumption.
- place to earth the control gate lines (CGL01, CGL02, CGL03, CGL10, CGL11, CGL12, CGL13) associated with the memory words not to read,
- apply a positive voltage, for example VDD (the value of which depends on the technology) to the word line WLi (WL0) of the row of the memory word to read,
- place to earth the word line WLi (WL1) of the row not containing the memory word to read,
- place to earth the source line SL, and
- place the interior substrate SUBint to earth.

The following table 3 indicates the voltages to apply to read the memory word WD1 without affecting the memory words WD2 to WD8.

TABLE 3

| Line Select. | Column Select. | Mot | BL | CGL | WL | SL | SUBint |
|---|---|---|---|---|---|---|---|
| YES | YES | WD1 | Pre-charge voltage | 0.5 V | VDD | GND | GND |
| YES | NO | WD3, WD5, WD7 | Floating | GND | VDD | GND | GND |
| NO | YES | WD2 | Pre-charge voltage | GND | GND | GND | GND |
| NO | NO | WD4, WD6, WD8 | Floating | GND | GND | GND | GND |

Table 3: Reading Voltages of the Memory Plane (FIG. 4)

The pre-charge voltage PRE (1V) makes it possible to polarise the bit lines BLk of the memory word to read to the voltage of 0.5 V before reading. During the reading phase, a current of around 100 nA is injected into each bit line BLk.

Figure 5:
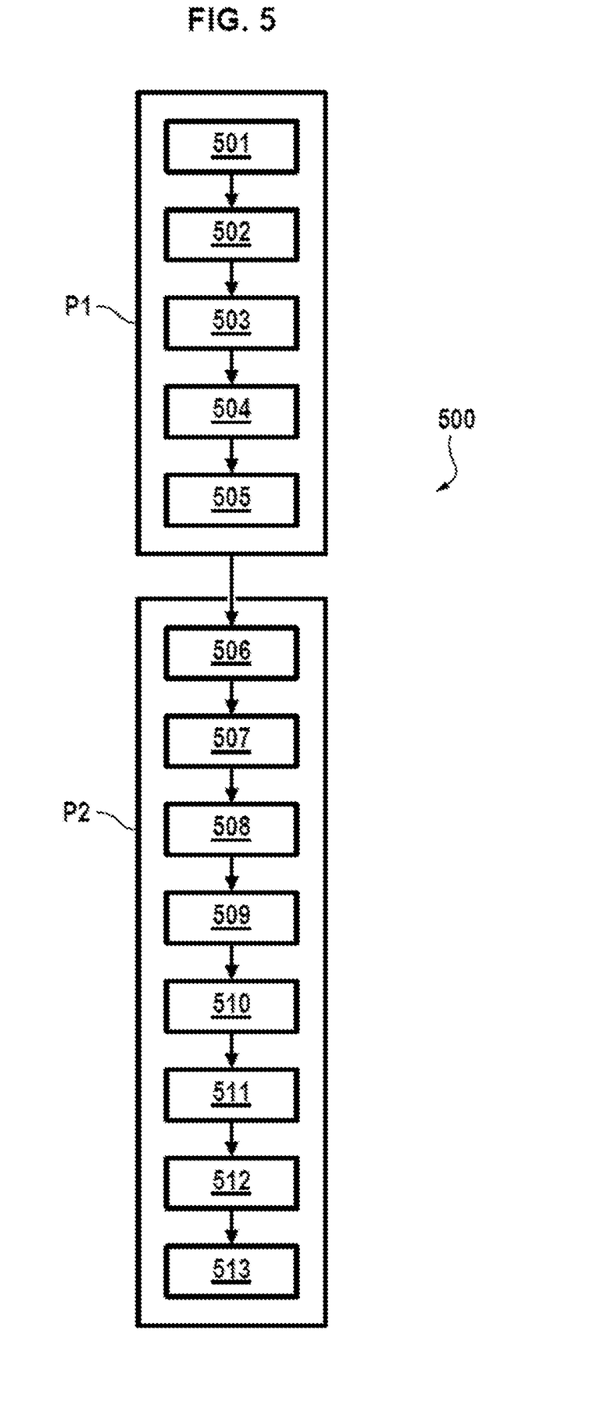
FIG. 5 is a block diagram of a procedure for writing a memory word according to an embodiment.

FIG. 5 represents a block diagram comprising the steps of a procedure for writing a memory word.

More specifically, the word WD1 is firstly erased in a first phase (as described in relation with table 1) and next programmed (as described in relation with table 2). This memory word is stored in a memory such as described in FIG. 4.

The method 500 comprising steps 501 to 513 is implemented by a data processing unit able to control the erasing device DEFF and the programming device DPROG.

The method 500 comprises:
a phase P1 of erasing the memory word, carried out by the erasing device DEFF, by:
- a step 501 of application of a positive voltage, for example 10.5 V, to the control gate lines CGL00 associated with the memory word to erase and to leave the bit lines BLk floating,
- a step 502 of connection to earth of the control gate lines CGL01, CGL02, CGL03, CGL10, CGL11, CGL12, CGL13 associated with the memory words not to erase,
- a step 503 of connection to earth of the word lines WL0 and WL1,
- a step 504 of application of a negative voltage, for example −3.3 V, to the source line SL, and
- a step 505 of connection of the interior substrate to a negative voltage, for example −3.3 V.

A phase P2 of programming the memory word carried out by the programming device DPROG, by:

a step 506 of application of a positive voltage, for example 3.3 V, to the bit lines BL of the cells not to programme, a step 507 of application of a positive voltage, for example 9.5 V, to the bit lines BLk of the cells to programme, a step 508 of application of a negative voltage, for example −3.3 V, to the control gate lines CGL00 associated with the memory word to programme, a step 509 of application of a positive voltage, for example 6 V, to the control gate lines CGL10 associated with the memory words situated on the same column as the memory word to programme, a step 510 of connection to earth of the control gate line CGL01, CGL02, CGL03, CGL11, CGL12, CGL13 associated with the other memory words, a step 511 of connection to earth of the word lines WL0 and WL1 associated with the memory words, a step 512 of application of a positive voltage, for example 3.3 V, to the source line SL, and a step 513 of connection to earth of the interior substrate SUBint.

FIG. 6 schematically illustrates a memory MEM2 according to a second embodiment.

The organisation of the memory MEM2 is essentially identical to that described in relation with FIG. 4, with the exception that the isolation barrier surrounds not all the cells, but several columns of memory words. Here, a barrier BI01 surrounds the columns COL0, COL1, and a barrier BI23 surrounds the columns COL2, COL3. Moreover, source lines SL01, SL23 specific to each group of columns (COL0 and COL1, and COL2 and COL3) are implemented.

The steps of the erasing procedure implemented by the erasing device DEFF are essentially identical to those described in relation with FIG. 4, but the voltages applied are different.

With reference to the memory words WD1 to WD8 represented in FIG. 6, the following table 4 indicates the voltages to apply to erase the memory word WD1 and to conserve the memory words WD2 to WD8.

TABLE 4

| Line Select. | Column Select. | Memory word | BL | CGL | WL | SL | SUBint |
|---|---|---|---|---|---|---|---|
| YES | YES | WD1 | Floating | 10.5V | GND | −3.3 V | −3.3 V |
| YES | NO | WD3 | Floating | GND | GND | −3.3 V | −3.3 V |
| YES | NO | WD5, WD7 | Floating | GND | GND | GND | GND |
| NO | YES | WD2 | Floating | GND | GND | −3.3 V | −3.3 V |
| NO | NO | WD4 | Floating | GND | GND | −3.3 V | −3.3 V |
| NO | NO | WD6, WD8 | Floating | GND | GND | GND | GND |

Table 4: Erasing Voltages of the Memory Plane (FIG. 6)

Similarly, the steps of the programming procedure implemented by the programming device DPROG are essentially identical to those described in relation with FIG. 4, but the voltages applied are different.

Compared to table 1, it may be observed that the voltages applied for the words (WD3, WD5, WD7 and WD4, WD6, WD8) differ in that the word is found in the same isolation barrier of the word to programme (WD1) or not.

That is to say that the voltages for the words WD3 and WD4, in the barrier BI01, and the voltages for the words WD5, WD6, WD7, WD8, in the barrier BI23, are different here, whereas for the embodiment explained in relation with table 1, there was no difference.

With reference to the memory words WD1 to WD8 represented in FIG. 6, the following table 5 indicates the voltages to apply to programme the memory word WD1 without affecting the memory words WD2 to WD8.

TABLE 5

| Line Select. | Column Select. | Mot | BL | CGL | WL | SL | SUBint |
|---|---|---|---|---|---|---|---|
| YES | YES | WD1 | 9.5 V/3.3 V | −3.3 V | GND | 3.3 V | GND |
| YES | NO | WD3 | 3.3 V | GND | GND | 3.3 V | GND |
| YES | NO | WD5, WD7 | GND | GND | GND | GND | GND |
| NO | YES | WD2 | 9.5 V/3.3 V | 6 V | GND | 3.3 V | GND |
| NO | NO | WD4 | 3.3 V | GND | GND | 3.3 V | GND |
| NO | NO | WD6, WD8 | GND | GND | GND | GND | GND |

Table 5: Programming Voltages of the Memory Plane (FIG. 6)

Compared to table 2, it may be observed that the voltages applied for the words (WD4, WD6, WD8) differ in that the word is found in the same isolation barrier of the word to programme (WD1) or not. That is to say that the voltages for the word WD4, in the barrier BI01, and the voltages for the words WD6, WD8, in the barrier BI23, are different here, whereas for the embodiment explained in relation with table 2, there was no difference.

Finally, the steps of the reading procedure implemented by the reading device DLEC are essentially identical to those implemented in relation with FIG. 4.

FIG. 7 schematically illustrates a memory according to a third embodiment.

The organisation of the memory MEM2 is essentially identical to that described in relation with FIG. 4, with the exception that the isolation barrier surrounds not all the cells, but each column of memory words. Here, the barriers BI0, BI1, BI2, BI3 surround the columns COL0, COL1, COL2, COL3 respectively. Moreover, source lines SL0, SL1, SL2, SL3, specific to each column (COL0, COL1, COL2, COL3) are implemented.

The steps of the erasing procedure implemented by the erasing device DEFF are essentially identical to those described in relation with FIG. 4, but the voltages applied are different.

With reference to the memory words WD1 to WD8 represented in FIG. 7, the following table 6 indicates the voltages to apply to erase the memory word WD1 and to conserve the memory words WD2 to WD8.

TABLE 6

| Line Select. | Column Select. | Mot | BL | CGL | WL | SL | SUBint |
|---|---|---|---|---|---|---|---|
| YES | YES | WD1 | Floating | 10.5 V | GND | −3.3 V | −3.3 V |
| YES | NO | WD3, WD5, WD7 | Floating | GND | GND | GND | GND |
| NO | YES | WD2 | Floating | GND | GND | −3.3 V | −3.3 V |
| NO | NO | WD4, WD6, WD8 | Floating | GND | GND | GND | GND |

Table 6: Erasing Voltages of the Memory Plane (FIG. 7)

Compared to table 1, it may be observed that the voltages applied for the words (WD3, WD5, WD7 and WD4, WD6, WD8) differ. In particular, the source lines SL and the inner substrates SUBint are to earth (GND) and not at −3.3 V. Each column being isolated, it is no longer necessary to place it at the same voltage.

Similarly, the steps of the programming procedure implemented by the programming device DPROG are essentially identical to those described in relation with FIG. 4, but the voltages applied are different.

With reference to the memory words WD1 to WD8 represented in FIG. 7, the following table 7 indicates the voltages to apply to programme the memory word WD1 without affecting the memory words WD2 to WD8.

TABLE 7

| Line Select. | Column Select. | Mot | BL | CGL | WL | SL | SUBint |
|---|---|---|---|---|---|---|---|
| YES | YES | WD1 | 9.5 V/3.3 V | −3.3 V | GND | 3.3 V | GND |
| YES | NO | WD3, WD5, WD7 | GND | GND | GND | GND | GND |
| NO | YES | WD2 | 9.5 V/3.3 V | 6 V | GND | 3.3 V | GND |
| NO | NO | WD4, WD6, WD8 | GND | GND | GND | GND | GND |

Table 7: Programming Voltages of the Memory Plane (FIG. 7)

Compared to table 2, it may be observed that the voltages applied for the words (WD3, WD5, WD7 and WD4, WD6, WD8) differ. In particular, the bit lines BLk and the source lines SL are to earth (GND) and not at 3.3 V. Each column being isolated, it is no longer necessary to place it at the same voltage.

The reading procedure implemented by the reading device DLEC is essentially identical to that implemented in relation with FIG. 4.

Isolation by column makes it possible to reduce the consumption of the EEPROM during writing (by applying voltages uniquely to the memory word to write) to the detriment of the surface area of the memory plane PM.

To summarise, the embodiments of the memory have the following advantages:
- Enable the use of lower positive voltages (in absolute values) namely 10.5V during the erasing step and 9.5V during the programming step.
- Make it possible to reduce the consumption of the EEPROM during writing.
- Make it possible to reduce by 30% the voltage that the charge pump has to generate.
- Make it possible to reduce the requirements on the high voltage devices of the peripheral circuits.

Description of the Writing Voltages of the Invention

The two charge pumps that deliver −3.3 V+/−5% and +3.3 V+/−5% are developed using so-called GO2 ("Gate Oxide 2" of 65 Angstroms) transistors.

In the erasing device DEFF, an analogue circuit enables the adjustment of the positive voltage applied to the control gate line CGLij associated with the memory word to erase from 10.5 V to 11.5 V.

During the erasing step, the difference in potential (also known as "VPP Erase") between the control gate CG and the source TEs of the state transistor TE makes it possible to inject by Fowler-Nordheim effect a charge of electrons into the floating gate.

$$VPP\ Erase = V_{CG(Byte\ Sel.)} - V_{TES}$$

TABLE 8

| Adjustment code | 000 | 001 | 010 | 011 | 100 |
|---|---|---|---|---|---|
| $V_{CG\ (Byte\ Sel.)}$ | 10.50 V | 10.75 V | 11.00 V | 11.25 V | 11.50 V |
| VPP Erase | 13.80 V | 14.05 V | 14.30 V | 14.55 V | 14.80 V |

Table 8: Erasing Values

In the programming device DPROG, an analogue circuit enables the adjustment of the positive voltage applied to the bit line BLk associated with the memory word to programme from 9.5 V to 10.5 V.

During the programming step, the difference in potential (also known as "VPP Prog") between the drain TEd, via the bit line and the control gate CG of the state transistor TE makes it possible to extract by Fowler-Nordheim effect the charge of electrons potentially stored in the floating gate.

$$VPP\ Prog = V_{BL(Sel)} - V_{CG(Byte\ Sel.)}$$

TABLE 9

| Adjustment code | 000 | 001 | 010 | 011 | 100 |
|---|---|---|---|---|---|
| $V_{BL\ (Sel.)}$ | 9.50 | 9.75 V | 10.00 V | 10.25 V | 10.50 V |
| VPP Prog | 12.80 V | 13.05 V | 13.30 V | 13.55 V | 13.80 V |

Table 9: Programming Values

In order not to disrupt the other memory words situated on the same column of the memory word to programme, it is necessary to respect the following condition:

$$V_{CG(Byte\ Unsel.\ in\ the\ same\ column)} = V_{BL(Sel)} - 3.5V$$

What is claimed is:

1. A memory of electrically erasable programmable read only memory type arranged in and on a semiconductor substrate, the memory comprising: a plurality of memory cells organized in a memory plane arranged in a matrix fashion in rows and in columns, each memory cell comprising a state transistor comprising a source region, a drain region connected to a bit line of the memory, an injection window directly adjacent to a side of the drain region, a control gate connected to a control gate line of the memory, and a floating gate, and an isolation transistor comprising a source region connected to a source line of the memory, a drain region connected to the source region of the state transistor, and a gate connected to a word line of the memory; and at least one isolation barrier comprising a buried layer disposed beneath the plurality of memory cells, and a wall extending from the buried layer to a surface of the substrate, wherein the wall of the at least one isolation barrier forms an interior substrate region surrounding at least two memory cells of the plurality of memory cells, the interior substrate region isolating the at least two memory cells from the remainder of the substrate, wherein the interior substrate region extends from the buried layer to the surface of the substrate and separates the at least two memory cells including the respective source and drain regions of the state and isolation transistors from the wall.

2. The memory according to claim 1, wherein the at least one isolation barrier is a single isolation barrier comprising a single wall surrounding all memory cells of the memory plane to isolate together all the memory cells of the memory plane.

3. The memory according to claim 2, further comprising circuitry for erasing a memory word, the circuitry configured to: leave the bit lines floating, apply a first positive voltage to the control gate lines associated with the memory cells of the memory word to be erased, connect to ground the control gate lines of the memory cells which are not associated with the memory word to be erased, connect to ground the word lines, connect to ground the source lines, and connect to ground the interior substrate region.

4. The memory according to claim 3, wherein a difference between the first positive voltage and ground enables a Fowler-Nordheim effect by injecting a charge of electrons into the floating gate of the state transistor.

5. The memory according to claim 1, wherein the at least one isolation barrier is a plurality of isolation barriers, each comprising a single wall surrounding a subset of the plurality of memory cells comprising memory cells of a respective column of the memory plane to isolate together all the memory cells belonging to the respective column of the memory plane.

6. The memory according to claim 5, further comprising circuitry for erasing a memory word, the circuitry configured to: leave the bit lines floating, apply a second positive voltage to the control gate lines associated with the memory cells of the memory word to be erased, connect to ground the control gate lines of the memory cells which are not associated with the memory word to be erased, connect to ground the word lines, apply a first negative voltage to the source lines, and apply the first negative voltage to the interior substrate region.

7. The memory according to claim 6, wherein a difference in voltages between the second positive voltage and the first negative voltage enables a Fowler-Nordheim effect by injecting a charge of electrons into the floating gate of the state transistor.

8. The memory according to claim 1, further comprising circuitry for programming a memory word, the circuitry configured to:
   apply a positive voltage to the bit lines of the memory cells of the memory word to be programmed,
   apply a positive voltage to the bit lines of the memory cells which are not to be programmed, the positive voltage applied to the bit lines of the memory cells which are not to be programmed being less than the positive voltage applied to the bit lines of the memory cells to be programmed,
   apply a negative voltage to the control gate lines of the memory cells associated with the memory word to be programmed,
   apply a positive voltage to the control gate lines of the memory cells situated on the same column as the memory word to be programmed,
   connect to ground the control gate lines of the memory cells which are not associated with the memory word to be programmed,
   connect to ground the word lines,
   apply a positive voltage to the source lines, and
   connect to ground the interior substrate region.

9. The memory according to claim 8, wherein the positive voltage applied to the bit lines of the memory cells of the memory word to be programmed is about 9.5V, wherein the positive voltage applied to the bit lines of the memory cells which are not to be programmed is about 3.3V, wherein the negative voltage applied to the control gate lines of the memory cells associated with the memory word to be programmed is about −3.3V, wherein the positive voltage applied to the control gate lines of the memory cells situated on the same column as the memory cells of the memory word to be programmed is about 6V, and wherein the positive voltage applied to the source lines is about 3.3V.

10. The memory according to claim 1, further comprising circuitry for reading a memory word, the circuitry configured to: apply a positive voltage to the bit lines of the memory cells of the memory word to be read, apply a positive voltage to the control gate lines of the memory cells of the memory word to be read, connect to ground the control gate lines of the memory cells which are not associated with the memory word to be read, apply a positive voltage to the word lines of the memory cells of the row associated with the memory word to be read, connect to ground the word lines of the memory cells which are not situated on the row associated with the memory word to be read, connect to ground the source lines, and connect the interior substrate region to earth.

11. The memory according to claim 10, wherein the positive voltage applied to the bit lines of the memory cells of the memory word to be read is about 1V, wherein the positive voltage applied to the control gate lines of the memory cells of the memory word to be read is about 0.5V, and wherein the positive voltage applied to the word lines of the memory cells of the row associated with the memory word to be read is VDD.

12. The memory according to claim 1, wherein the plurality of memory cells is further organized as a plurality of words, each comprising a subset of the plurality of memory cells, and wherein the at least one isolation barrier is a plurality of isolation barriers, each comprising a single wall surrounding all memory cells of a respective word of the memory plane to isolate together all the memory cells belonging to the respective word of the memory plane.

13. A method for a memory of electrically erasable programmable read only memory type arranged in and on a semiconductor substrate, wherein the memory comprises a plurality of memory cells organized in a memory plane arranged in a matrix fashion in rows and in columns, each memory cell comprising a state transistor comprising a source region, a drain region, an injection window situated on a side of the drain region, a control gate and a floating gate and an isolation transistor having a source region, a drain region and a gate; and an isolation barrier comprising a buried layer and at least one wall extending from the buried layer to a surface of the substrate, wherein the at least one wall is perpendicular to the buried layer, wherein the isolation barrier forms an interior substrate surrounding at least one of the memory cells and isolating it from the remainder of the substrate, wherein the control gate of the state transistor is connected to a control gate line of the memory, wherein the source region of the isolation transistor is connected to a source line of the memory, wherein the gate of the isolation transistor is connected to a word line of the memory, and wherein the drain region of the state transistor is connected to bit line, the method comprising:
   erasing, in a first phase, a memory word by:
      applying a positive voltage to the control gate lines associated with the memory cells of the memory word to be programmed,
      connecting to ground the control gate lines of the memory cells which are not associated with the memory word to be programmed,
      connecting to ground the word lines,
      applying of a negative voltage to the source lines, and
      applying a negative voltage to the interior substrate; and
   programming, in a second phase after the first phase, the memory word by:
      applying a positive voltage to the bit lines of the memory cells to be programmed, applying a positive voltage to the bit lines of the memory cells which are not to be programmed, applying a negative voltage to the control gate lines of the memory cells associated with the memory word to be programmed, applying a positive voltage to the control gate lines of the memory cells situated on the same column as the memory word to be programmed, connecting to ground the control gate lines of the memory cells which are not associated with the memory word to write, connecting to ground the word lines, applying a positive voltage to the source lines, and connecting to ground the interior substrate.

14. The method according to claim 13, wherein the positive voltage applied to the control gate lines associated with the memory cells of the memory word to be programmed is about ni V, wherein the negative voltage applied to the source lines is about −3.3V, wherein the negative voltage applied to the interior substrate is about −3.3V, wherein the positive voltage applied to the bit lines of the memory cells to be programmed is about 9.5V, wherein the positive voltage applied to the bit lines of the memory cells which are not to be programmed is about 3.3V, wherein the negative voltage applied to the control gate lines of the memory cells associated with the memory word to be programmed is about −3.3V, and wherein the positive voltage applied to the control gate lines of the memory cells situated on the same column as the memory word to be programmed is about 6V, and wherein the positive voltage applied to the source lines is about 3.3V.

15. A method for a memory of electrically erasable programmable read only memory type arranged in and on a semiconductor substrate, wherein the memory comprises a plurality of memory cells organized in a memory plane arranged in a matrix fashion in rows and in columns, each memory cell comprising a state transistor comprising a source region, a drain region, an injection window situated on a side of the drain region, a control gate and a floating gate and an isolation transistor having a source region, a drain region and a gate; and an isolation barrier comprising a buried layer and at least one wall extending from the buried layer to a surface of the substrate, wherein the at least one wall is perpendicular to the buried layer, wherein the isolation barrier forms an interior substrate surrounding at least one of the memory cells and isolating it from the remainder of the substrate, wherein the control gate of the state transistor is connected to a control gate line of the memory, wherein the source region of the isolation transistor is connected to a source line of the memory, wherein the gate of the isolation transistor is connected to a word line of the memory, and wherein the drain region of the state transistor is connected to bit line, the method comprising:

erasing a memory word by leaving the bit lines floating, applying a positive voltage to the control gate lines associated with the memory cells of the memory word to be erased, connecting to ground the control gate lines of the memory cells which are not associated with the memory word to be erased, and connecting to ground the word lines.

16. The method according to claim 15, wherein erasing the memory word further comprises connecting to ground the source lines, and connecting to ground the interior substrate when the isolation barrier isolates together all the memory cells of the memory plane.

17. The method according to claim 15, wherein erasing the memory word further comprises applying a negative voltage to the source lines, and applying the negative voltage to the interior substrate when the isolation barrier isolates together all the memory cells belonging to a column of the memory plane.

18. The method according to claim 15, further comprising: programming a memory word by applying a first positive voltage to the bit lines of the memory cells of the memory word to be programmed, applying a second positive voltage to the bit lines of the memory cells which are not to be programmed but are situated on the same column as the memory word to be programmed, the second positive voltage being less than the first positive voltage, applying a negative voltage to the control gate lines of the memory cells associated with the memory word to be programmed, applying a third positive voltage to the control gate lines of the memory cells which are not to be programmed but are situated on the same column as the memory word to be programmed, connecting to ground the control gate lines of the memory cells of the memory words which are not to be programmed and are not situated on the same column as the word to be programmed, connecting to ground the word lines, applying the second positive voltage to the source lines of the memory cells of the memory word to be programmed and the source lines of the memory cells which are not to be programmed but are situated on the same column as the memory word to be programmed, and connecting to ground the interior substrate.

19. The method according to claim 18, wherein programming the memory word further comprises applying the second positive voltage to the bit lines of the memory words which are not to be programmed and are not situated on the same column as the word to be programmed, and applying the second positive voltage to the source lines of the memory words which are not to be programmed and are not situated on the same column as the word to be programmed.

20. The method according to claim 18, wherein programming the memory word further comprises connecting to ground the bit lines of the memory words which are not to be programmed and are not situated on the same column as the word to be programmed, and connecting to ground the source lines of the memory words which are not to be programmed and are not situated on the same column as the word to be programmed.

\* \* \* \* \*

UNITED STATES PATENT AND TRADEMARK OFFICE
CERTIFICATE OF CORRECTION

PATENT NO. : 12,125,532 B2
APPLICATION NO. : 17/459172
DATED : October 22, 2024
INVENTOR(S) : Laurent Murillo Page 1 of 1

It is certified that error appears in the above-identified patent and that said Letters Patent is hereby corrected as shown below:

In the Claims

In Column 15, Line 18, Claim 14:
Change "programmed is about ni V, wherein the negative voltage applied"
To --programmed is about 11 V, wherein the negative voltage applied--

Signed and Sealed this
Third Day of December, 2024

Katherine Kelly Vidal
Director of the United States Patent and Trademark Office